(12) United States Patent
Su

(10) Patent No.: US 7,892,962 B2
(45) Date of Patent: Feb. 22, 2011

(54) NAIL-SHAPED PILLAR FOR WAFER-LEVEL CHIP-SCALE PACKAGING

(75) Inventor: Chao-Yuan Su, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 582 days.

(21) Appl. No.: 11/850,518

(22) Filed: Sep. 5, 2007

(65) Prior Publication Data
US 2009/0057896 A1 Mar. 5, 2009

(51) Int. Cl.
*H01L 23/488* (2006.01)
*H01L 21/4763* (2006.01)

(52) U.S. Cl. ............... 438/612; 257/E21.171; 257/E21.506; 257/E21.517; 257/E21.522; 257/E21.526; 438/14; 438/15

(58) Field of Classification Search .......... 257/E21.171, 257/E21.506, E21.517, E21.522, E21.526; 438/14, 15, 612; 738/14, 15, 612
See application file for complete search history.

(56) References Cited

U.S. PATENT DOCUMENTS

| | | | |
|---|---|---|---|
| 6,033,977 A * | 3/2000 | Gutsche et al. ............ | 438/618 |
| 6,137,178 A * | 10/2000 | Park ........................... | 257/758 |
| 6,372,619 B1 | 4/2002 | Huang et al. | |
| 6,547,124 B2 * | 4/2003 | Shah et al. ................. | 228/246 |
| 7,169,697 B2 * | 1/2007 | Seta et al. .................. | 438/618 |
| 7,476,980 B2 * | 1/2009 | Rebibis et al. ............. | 257/782 |
| 2002/0052065 A1 * | 5/2002 | Ogura ........................ | 438/128 |
| 2005/0032334 A1 * | 2/2005 | Shibata ....................... | 438/462 |
| 2005/0167830 A1 | 8/2005 | Chang et al. | |
| 2005/0173809 A1 | 8/2005 | Yamamoto et al. | |

* cited by examiner

*Primary Examiner*—Wael M Fahmy
*Assistant Examiner*—Peniel M Gumedzoe
(74) *Attorney, Agent, or Firm*—Slater & Matsil, L.L.P.

(57) ABSTRACT

A wafer-level chip-scale packaging feature for a semiconductor device is disclosed which has a substrate, a plurality of nail-shaped conducting posts extending from a surface of the substrate, and a plurality of solder balls, where each of the solder balls is connected to one of the nail-shaped conducting posts. When a different-sized solder ball is desired for use, the device can be re-processed by only removing and replacing the cross-members of the nail-shaped conducting posts, which cuts down on the re-processing expense.

9 Claims, 11 Drawing Sheets

NAIL-SHAPED PILLAR FOR WAFER-LEVEL CHIP-SCALE PACKAGING

TECHNICAL FIELD

The present invention relates generally to wafer-level chip-scale packaging (WLCSP), and more particularly to nail-shaped pillars used in WLCSP.

BACKGROUND

The past few decades have seen many shifts in electronics and semiconductor packaging that have impacted the entire semiconductor industry. The introduction of surface-mount technology (SMT), ball grid array (BGA), and land grid array (LGA) packages were generally important steps for high-throughput assembly of a wide variety of integrated circuit (IC) devices, while, at the same time, allowing reduction of the pad pitch on the printed circuit board. Conventionally packaged ICs have a structure basically interconnected by fine gold wire between metal pads on the die and electrodes spreading out of molded resin packages. Dual Inline Package (DIP) or Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP), BGA, and LGA are just some of the solutions that enable dense electrode arrangement without greatly increasing the package size. CSP provides for wafer packaging on a chip-size scale. CSP typically results in packages within 1.2 times the die size, which greatly reduces the potential size of devices made with the CSP material. Although, these advances have allowed for miniaturization in electronic devices, the ever-demanding trend toward even smaller, lighter, and thinner consumer products have prompted even further attempts at package miniaturization.

To fulfill market demands toward increased miniaturization and functionality, wafer-level CSP (WLCSP) has been introduced in recent years for generally increasing density, performance, and cost-effectiveness, while decreasing the weight and size of the devices in the electronic packaging industry. In WLCSP, the packaging is typically generated directly on the die with contacts provided by BGA or LGA. Recent advanced electronic devices, such as mobile phones, mobile computers, camcorders, personal digital assistants (PDAs), and the like, utilize compact, light, thin, and very densely packaged ICs. Using WLCSP for packaging smaller die size devices with lower numbers of pins, corresponding to larger number of chips on one wafer, is, therefore, usually advantageous and cost-effective.

One disadvantage of current WLCSP contact technology is the shape of the contact pillars formed between the wafer and the solder balls. According to the current WLCSP procedures, the contact pillar diameter will also be the final size for the solder ball pad. If it is discovered later in the manufacturing process that a larger-size solder ball drop will work better for the semiconductor device, the pillar diameter will be increased accordingly. This enlarging process not only increases the plating costs, it is also not generally a good solution for finer pitch pad design.

FIG. 1 is a cross-section view of die package 10. Die package 10 typically comprises wafer 100 and contact pillars 101 within insulating layer 101. Solder balls 103 are then printed, placed, or soldered onto the tops of each of contact pillars 101. If, later in the manufacturing process, it is realized that, instead of solder balls 103, larger-diameter solder balls, such as solder balls 104 (illustrated as the dotted line), should be used, insulating layer 102 will be etched with additional material plated into the etched sections to enlarge contact pillars 101 into contact pillars 105 (shown as dotted line). This enlarging process increases the manufacturing steps and the plating costs to create the larger contact pillars 105.

It should be noted that, for ease illustration, the larger solder ball and contact pillar were shown as dotted lines around only one of the noted features. In practice, each of the solder balls and contact pillars would be replaced with the enlarged version illustrated in the dotted line segments.

SUMMARY OF THE INVENTION

These and other problems are generally solved or circumvented, and technical advantages are generally achieved, by preferred embodiments of the present invention that provide wafer-level chip-scale packaging (WLCSP) conducting pillars having nail-shaped cross-sections. The recess columns and caps that create the nail-shape may be separately formed in two different laminate film layers, after which a conductive material, such as copper, may be plated or deposited to form nail-shaped conducting pillars. After removal of the laminate, an encapsulating layer, made from various types of epoxy or resin, is placed onto the substrate surface, encapsulating the nail-shaped pillars. When a solder bump of a varying size is used that is too big or too small for the fabricated cross-member or head of the nail-shaped pillars, only the cross-member is re-processed (i.e., removed and re-shaped to fit the solder ball/bump) to accommodate the appropriately-sized bump/ball.

In accordance with a preferred embodiment of the present invention, a method for modifying a ball drop layer on a semiconductor device includes removing the ball drop layer from a surface of the semiconductor device. The ball drop layer is made up from a cross-member for each of a plurality of nail-shaped conducting pillars and an epoxy layer encapsulating the cross-members. A laminate film is deposited over the surface into which a plurality of recesses is formed. The recesses are selectively sized to create a new cross-member width. The recesses are filled with a conductive material to form a plurality of new nail-shaped conducting pillars.

In accordance with another preferred embodiment of the present invention, a semiconductor die package is made up of a substrate, a plurality of nail-shaped conducting posts extending from a surface of the substrate and a plurality of solder balls, where each of the solder balls is connected to one of the nail-shaped conducting posts.

In accordance with another preferred embodiment of the present invention, a method for manufacturing a WLCSP connector array includes removing a first layer from a surface of a semiconductor wafer. The first layer is made up of a plurality of cross-members each attached to a corresponding one of a plurality of nail-shaped pillars. The first layer also includes encapsulating material encapsulating the cross-members. A patternable material is deposited on the surface of the semiconductor wafer into which a pattern is created. The pattern corresponds to a plurality of new cross-members for the nail-shaped pillars. A conducting material is then deposited in the pattern to form the plurality of new cross-members. Those new cross-members are encapsulated with the encapsulating material on the surface.

In accordance with another preferred embodiment of the present invention, a semiconductor die includes a plurality of nail-shaped conducting posts extending from a surface of the semiconductor die, a plurality of solder balls each connected to one of the nail-shaped conducting posts, and an encapsulation layer on the surface, where the tops of the nail-shaped conducting posts extend through the encapsulation layer.

In accordance with another preferred embodiment of the present invention, a semiconductor die includes a plurality of nail-shaped conducting posts extending from a surface of the semiconductor die, which is one of a plurality of dies in a wafer. A plurality of cross-members each attach to a corresponding one of the plurality of nail-shaped conducting posts. A plurality of solder balls is connected to one of the plurality of cross-members. An encapsulation layer on the surface, through which the plurality of nail-shaped conducting posts extend.

An advantage of a preferred embodiment of the present invention is that only the cross-members of the nail shape are modified when a solder ball size does not fit onto the existing cross-member.

A further advantage of a preferred embodiment of the present invention is the cost-savings experienced by decreased processing that occurs when the solder ball size affects the ball drop used with the array.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a wafer-level chip-scale packaging (WLCSP) semiconductor die package having copper conducting posts. The invention may also be applied, however, using other materials in the WLCSP semiconductor die package.

Figure 1:
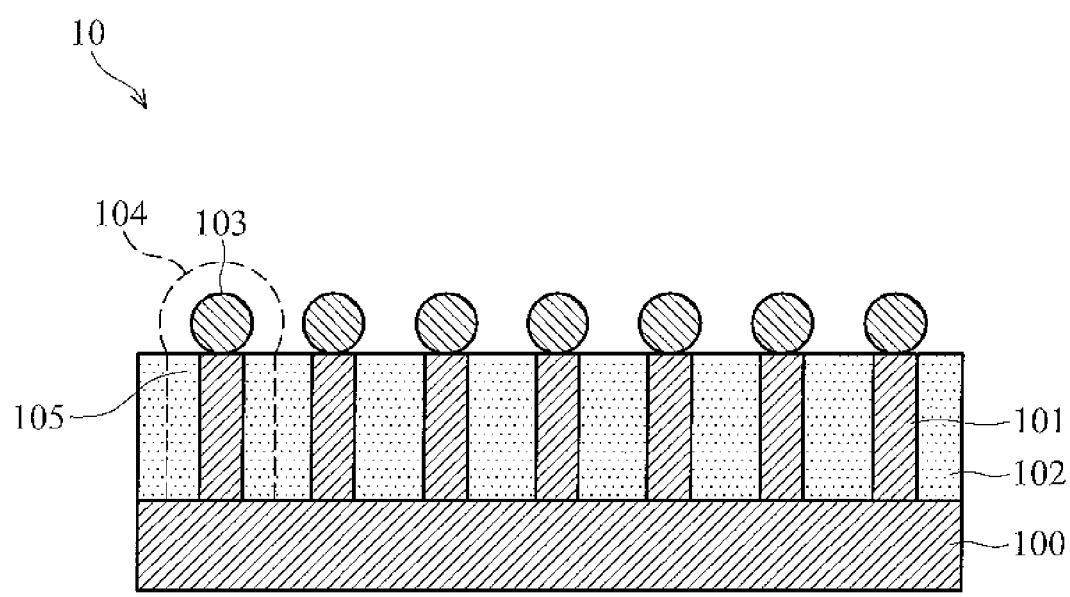
FIG. 1 is a cross-sectional view of a typical die package.
Figure 2A:
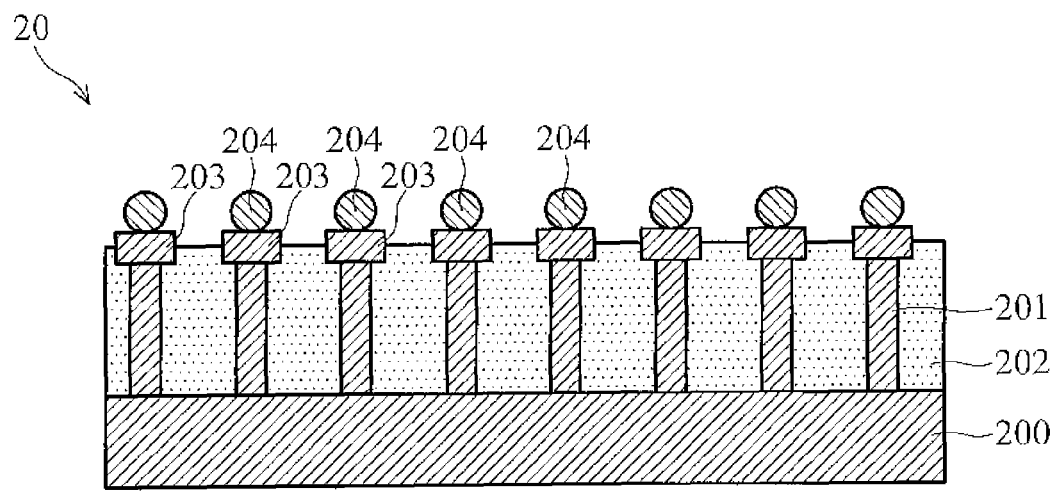
FIG. 2A-2D are cross-sectional views of die packages configured according to one embodiment of the present invention.

With reference now to FIG. 2A, there is shown a cross-sectional view of die package 20 configured according to one embodiment of the present invention. Die package 20 comprises wafer 200, conducting pillars 201, encapsulating epoxy 202, and solder balls 204. Conducting pillars 201 are preferably configured in a nail shape having cross-members 203 across the top portion of each of conducting pillars 201. Cross-members 203 of conducting pillars 201 provide the landing for solder balls 204. However, during further processing, it is determined that solder balls 204 are too small for the intended purpose of die package 20.

Figure 2B:
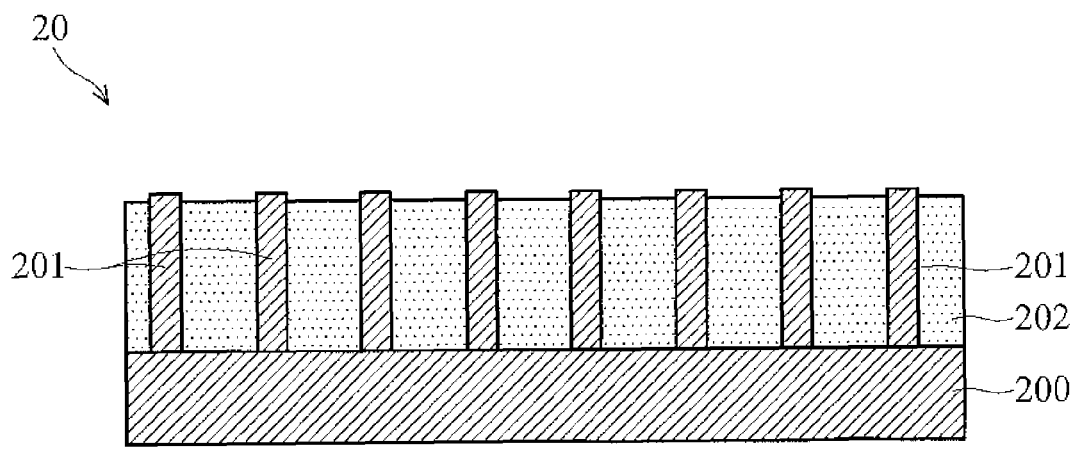

FIG. 2B is a cross-sectional view of die package 20 during a processing step according to one embodiment of the present invention. In order to process die package 20 to accommodate a larger size of solder ball, solder balls 204 (FIG. 2A) are removed and cross-members 203 are removed. The layer of die package 20 that includes cross-members 203 and any of encapsulating epoxy 202 that surrounds cross-members 203 is referred to herein as the ball drop layer. Various methods for removing solder balls 204 (FIG. 2A) and the ball drop layer, i.e., portions of encapsulating epoxy 202 and cross-members 203, may be used, including chemical mechanical polishing (CMP), wet/dry etching, or the like. Once removed from die package 20, substrate 200, conducting pillars 201, and encapsulating epoxy 202 remain. The top portions of conducting pillars 201 protrude from the top surface of encapsulating epoxy 202.

Figure 2C:
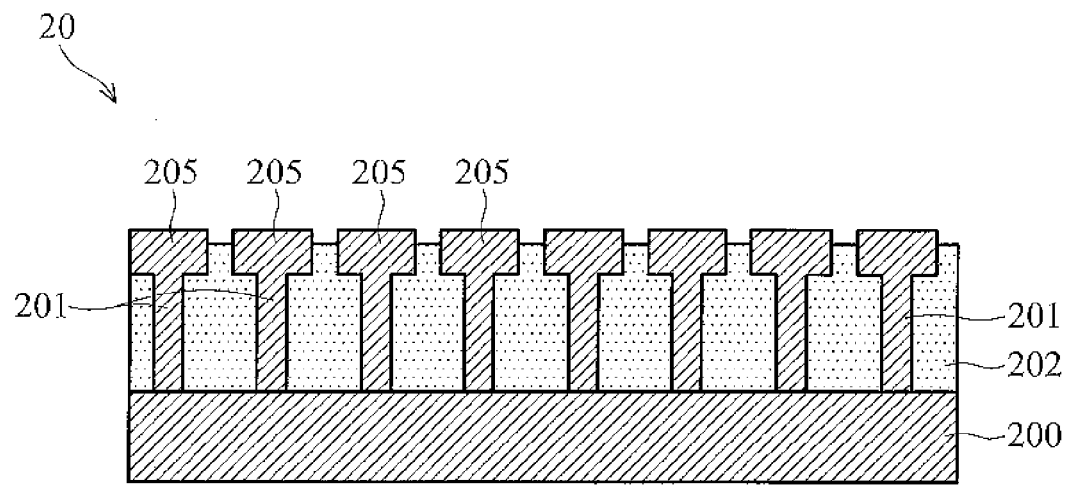

FIG. 2C is a cross-sectional view of die package 20 during a processing step according to one embodiment of the present invention. Cross-members 205 have been deposited onto die package 20, where each of cross-members 205 have been placed in a nail configuration connected to conducting pillars 201. Cross-members 205 are larger in surface area than cross-members 203 (FIG. 2A) in order to accommodate the larger-sized solder ball.

Figure 2D:
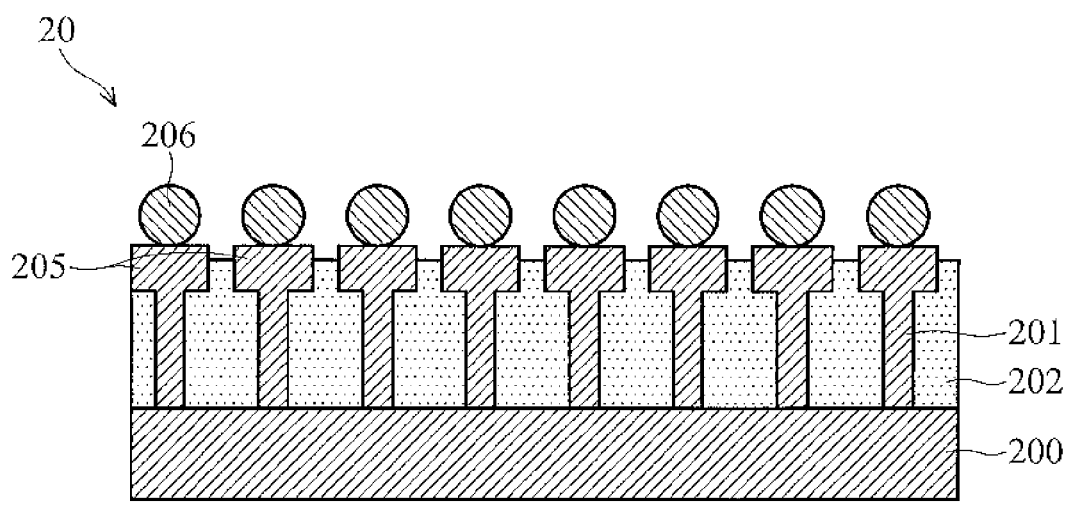

FIG. 2D is a cross-sectional view of die package 20 configured according to one embodiment of the present invention. After fabricating cross-members 205 onto die package 20, solder balls 206 are printed or deposited onto cross-members 205. The larger size of cross-members 205 provides an adequate connection between conducting pillars 201 and solder balls 206. Because the re-fit of die package 20 to accommodate the larger-sized solder balls 206 comprised only reprocessing the cross-member portion of the nail-shaped conducting pillar, i.e., cross-members 203 (FIG. 2A) of conducting pillars 201, the amount of reprocessing and re-metallization is minimized, thus, increasing the cost-effectiveness of the entire process.

It should be noted that, depending on the materials used in conducting pillars 201 and solder balls 204 and 206, solder balls 204 and 206 may either be placed directly onto conducting pillars 201 or placed onto a layer of under bump metallurgy (UBM) deposited between conducting pillars 201 and either of solder balls 204 or 206. The various embodiments of the present invention are not limited solely to direct placement.

Figure 3A:
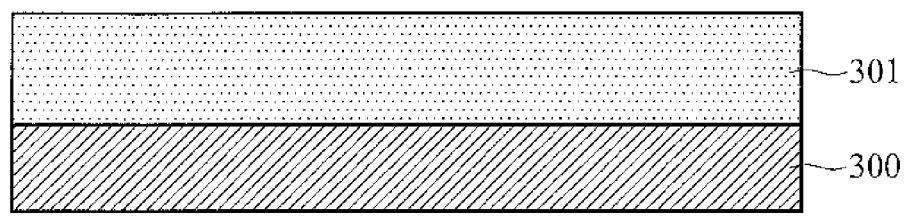
FIGS. 3A-J are cross-sectional views of a semiconductor wafer during processes according to one embodiment of the present invention.
Figure 3B:
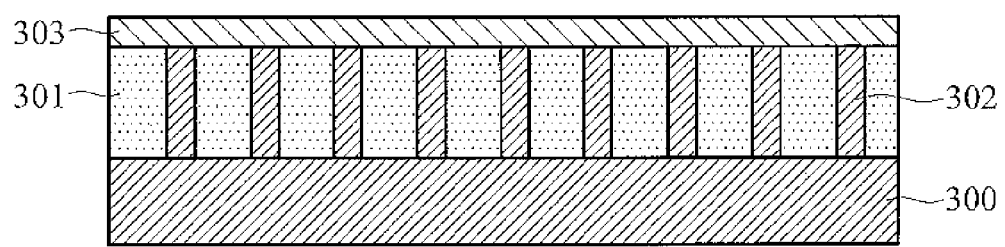
Figure 3C:
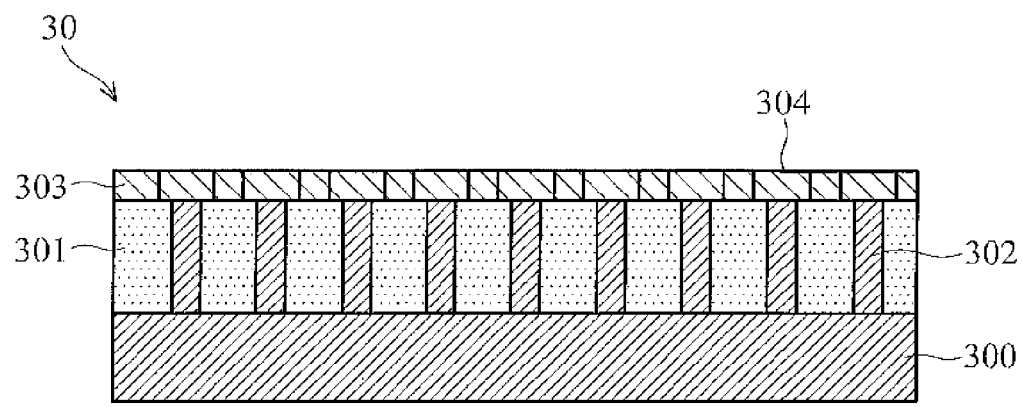
Figure 3D:
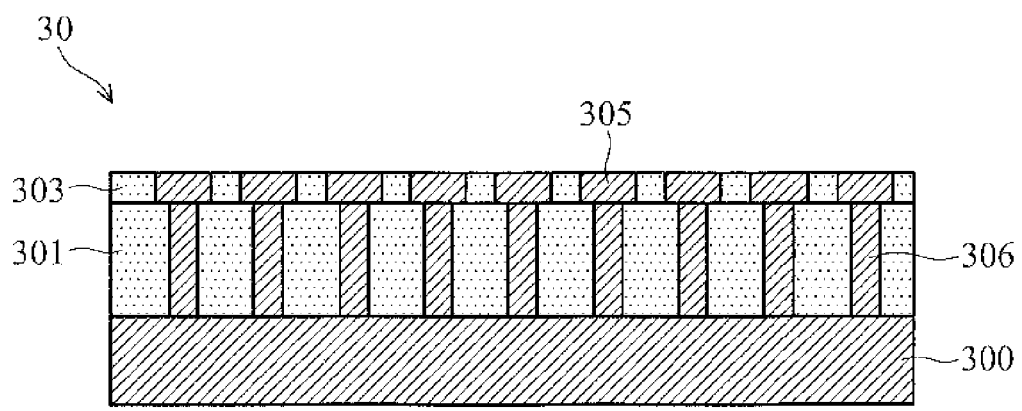

FIGS. 3A-J are cross-sectional views of semiconductor wafer 30 during the process of forming conducting posts according to one embodiment of the present invention. Laminate film layer 301 is deposited onto substrate 300. A series of recess columns (e.g., recesses 302—FIG. 3B) are then developed or formed in laminate film layer 301. After formation of recesses 302, a second laminate film, laminate film 303 is deposited onto the top of semiconductor wafer 30, as shown in FIG. 3B. FIG. 3C shows a series of countersink voids or recess caps, i.e., countersinks 304, developed or formed in laminate film 303.

A deposition process, such as electroplating, sputtering, or the like, is used to deposit a conducting material, such as copper, gold, aluminum, tungsten, various conductive alloys, or the like, into recesses 302 and countersinks 304. The deposition of the conducting material forms conducting posts 306 with cross-members 305 onto substrate 300, as shown in FIG.

Figure 3E:
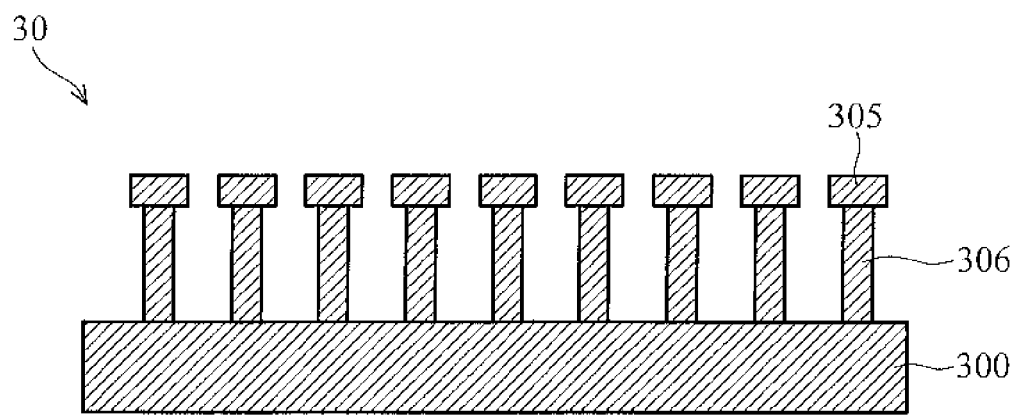
Figure 3F:
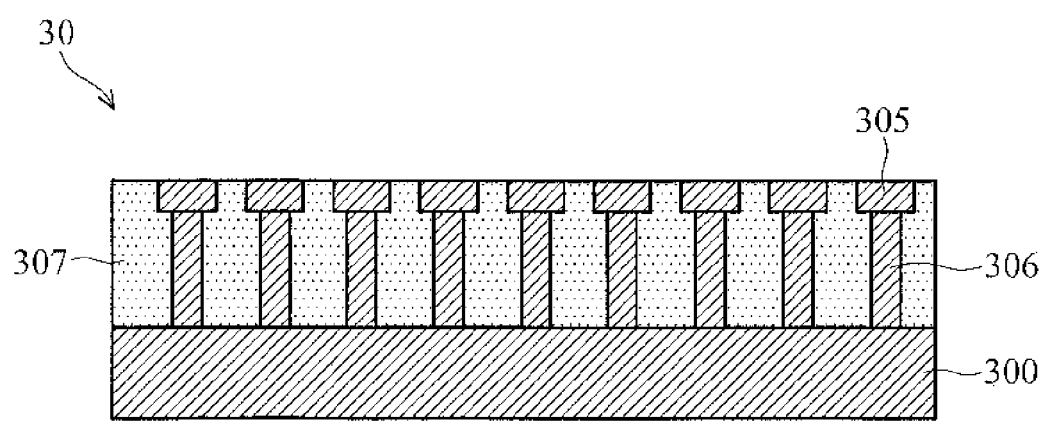

3D. The remaining portions of laminate films 301 and 303 are removed, leaving conducting posts 306 and cross-members 305 extending from the surface of substrate 300, as shown in FIG. 3E. FIG. 3F illustrates semiconductor wafer 30 after an encapsulating layer, such as epoxy layer 307, has been deposited encapsulating conducting posts 306 and cross-members 305.

It should be noted that in additional and/or alternative embodiments of the present invention, various different epoxy or resin materials may be used for an encapsulating layer. Additionally, in such various embodiments of the present invention, conducting posts 306 and cross-members 305 may be fabricated into various desired heights, depending on the intended application of the final die package.

Figure 3G:
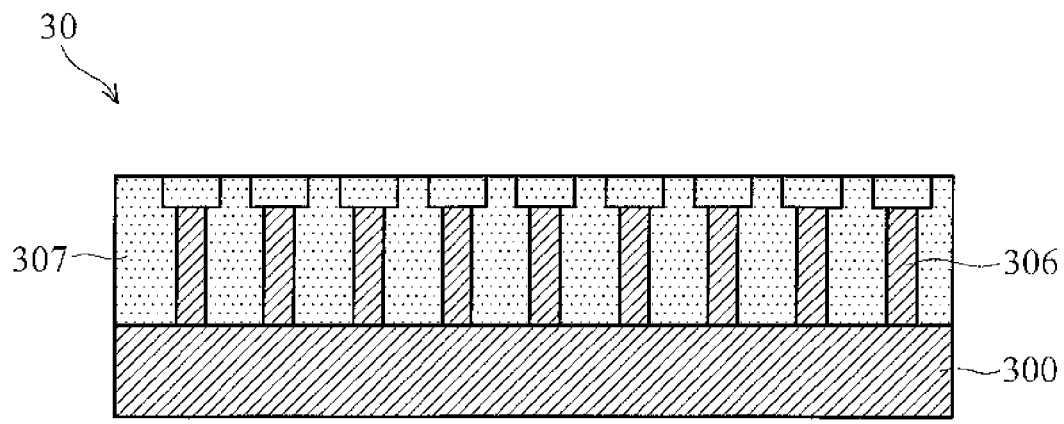

Design considerations cause a determination of the use of smaller solder balls or bumps than originally designed. Thus, cross-members 305 are too large for the contemplated solder balls. The discrepancy in size may cause a risk for short-circuiting connections across conducting posts 306. Thus, a determination is made to reprocess semiconductor wafer 30 for the appropriately sized cross-member. FIG. 3G is a cross-sectional view of semiconductor wafer 30 during a process according to one embodiment of the present invention. Semiconductor wafer 30 is processed to remove the ball drop layer, i.e., cross-members 305 and any portion of epoxy layer 307 encapsulating cross-members 305. Thus, conducting posts 306, epoxy layer 307, and substrate 300 remain.

Figure 3H:
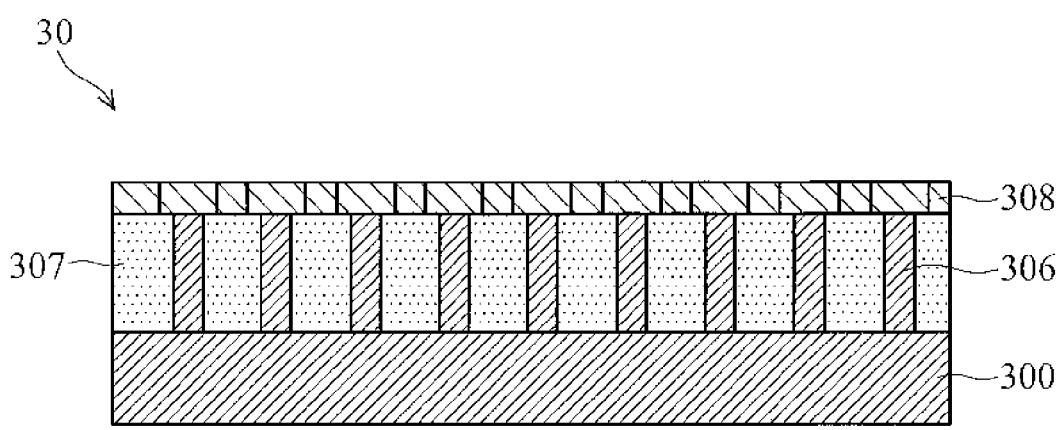
Figure 3I:
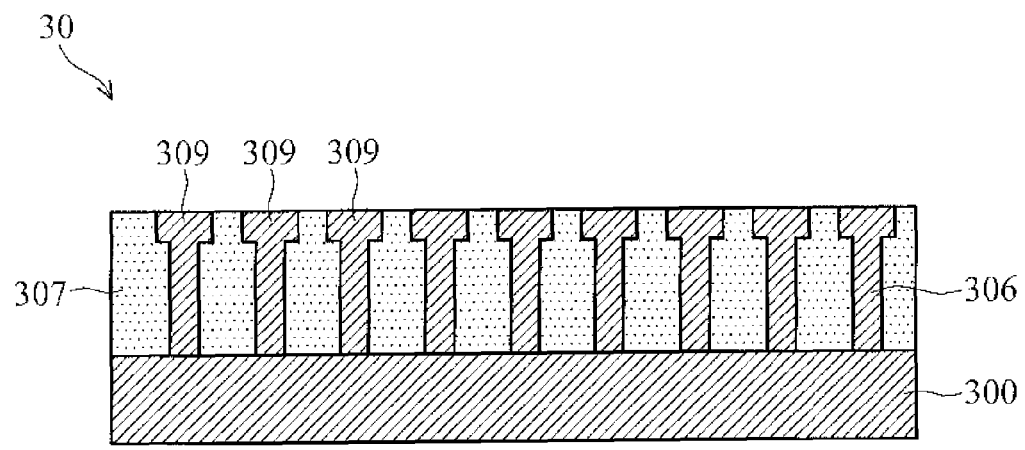

FIG. 3H is a cross-sectional view of semiconductor wafer 30 during a process according to one embodiment of the present invention. Mask layer 308 is formed on the top surface of semiconductor wafer 30 providing recesses for new cross-members. A conducting material is the deposited over mask layer 308 to form cross-members 309 (FIG. 3I). FIG. 3I illustrates the cross-sectional view of semiconductor wafer 30 after mask layer 308 (FIG. 3H) has been removed and epoxy layer 307 is extended to encapsulate cross-members 309. Cross-members 309 are smaller than cross-members 305, which allows semiconductor wafer 30 to accommodate smaller solder bumps or balls.

Figure 3J:
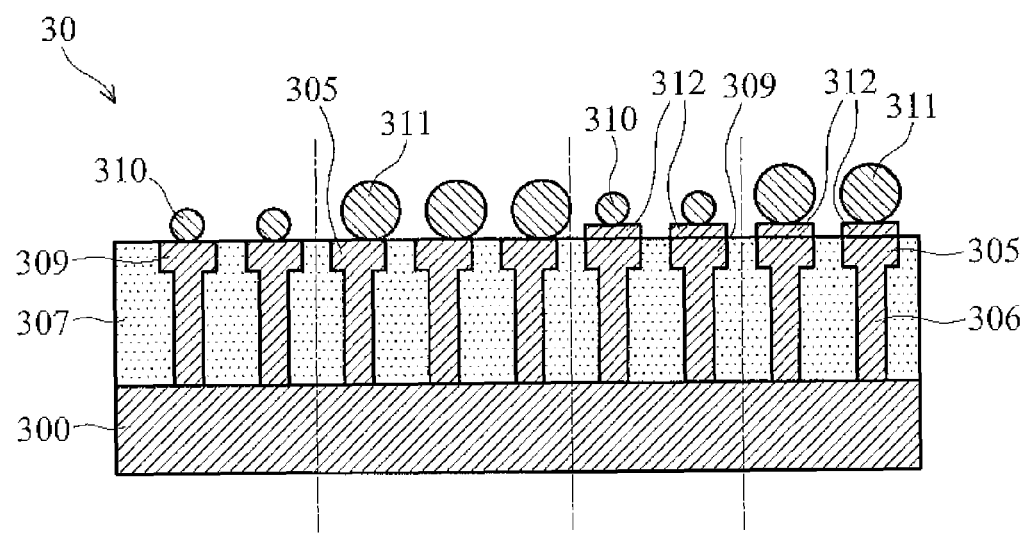

FIG. 3J is a cross-sectional view illustrating various examples of die package 31 having conducting posts 306 configured according to one embodiment of the present invention. Die package 31 is conceptually divided to illustrate multiple different embodiments of solder balls and solder ball connections to conducting posts 306. In the first section, small solder balls 310 are placed directly onto cross-members 309 of conducting posts 306. In the second section, larger solder balls 311 are placed onto the larger cross-members, cross-members 305, of conducting posts 306. The third section illustrates UBM layer 312 that acts as an interface between small solder balls 310, cross-members 309, and conducting posts 306. The fourth section illustrates larger solder balls 311 connected to conducting posts 306 and cross-member 305 through UBM layer 312.

Figure 4:
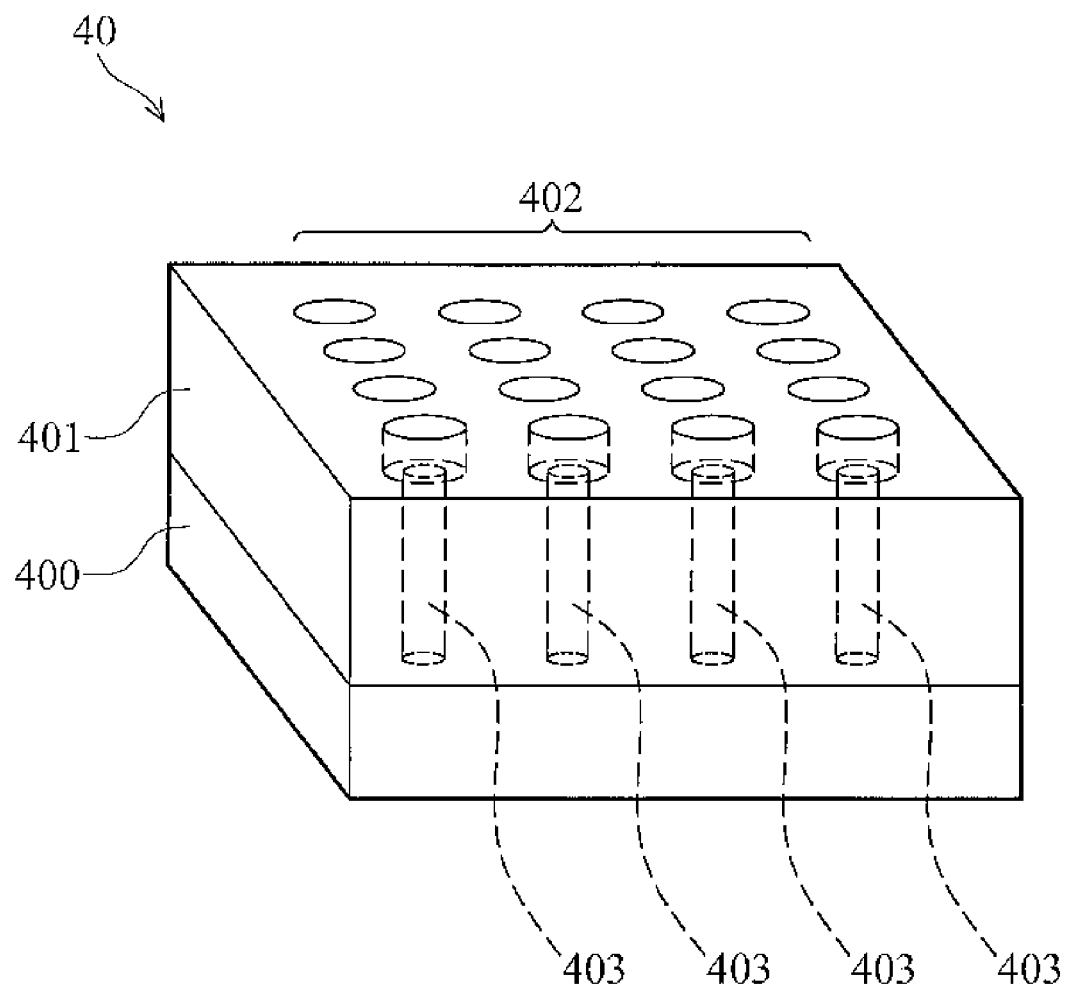
FIG. 4 is an isometric view illustrating a die package configured according to one embodiment of the present invention.

The purely cross-sectional views shown in FIGS. 2A-2D and 3A-3J are two-dimensional renderings of a nail-shaped conducting post. The cross-sectional views appear to be 'T'-shaped, when, in fact, the nail shape corresponds more to a cylindrical structure. FIG. 4 is an isometric view of die package 40 configured according to one embodiment of the present invention. Die package 40 is made up from substrate 400 and encapsulating epoxy 401. Formed within encapsulating epoxy 401 are conducting posts 403, the first row of which are represented by dotted lines extending toward substrate 400, and cross-members 402, the top surfaces of which are visible through encapsulating epoxy 401, while the portions located below the surface of encapsulating epoxy 401 are also represented, for the first row, by dotted lines. The isometric view of FIG. 4 provides a more three-dimensional representation of this embodiment of the present invention.

Figure 5:
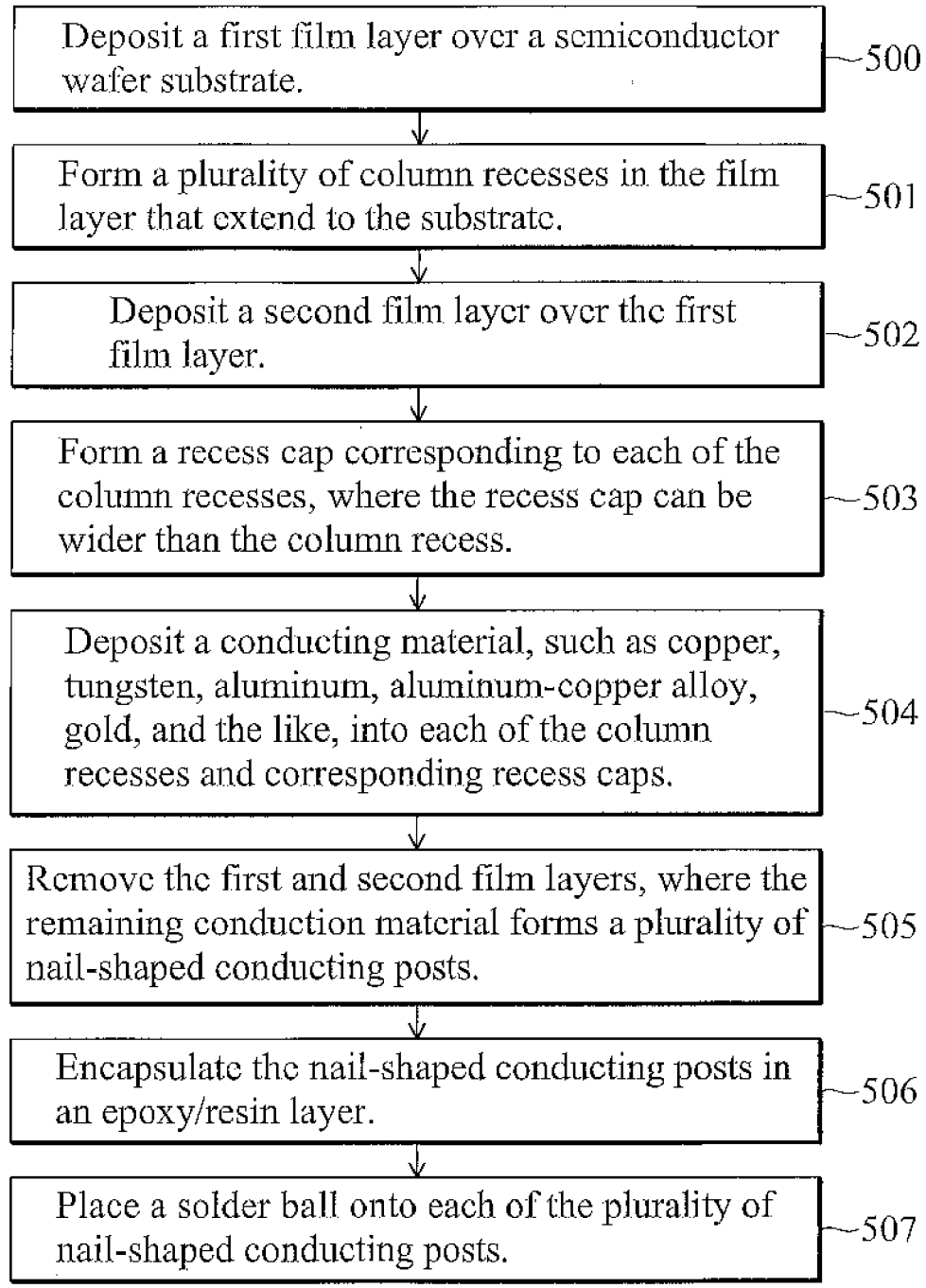
FIG. 5 is a flowchart illustrating example steps executed when implementing one embodiment of the present invention.

FIG. 5 is a flowchart illustrating example steps executed when implementing one embodiment of the present invention. In step 500, a first film layer is deposited over a semiconductor wafer substrate. A plurality of column recesses is formed, in step 501, in the film layer that extends to the substrate. A second film layer is deposited over the first film layer in step 502. A recess cap is formed, in step 503, corresponding to each of the column recesses, where the recess cap can be wider than the column recess. A conducting material, such as copper, tungsten, aluminum, aluminum-copper alloy, gold, and the like, is deposited, in step 504, into each of the column recesses and corresponding recess caps. In step 505, the first and second film layers are removed, where the remaining conducting material forms a plurality of nail-shaped conducting posts. The nail-shaped conducting posts are encapsulated in an epoxy/resin layer in step 506.

Figure 6:
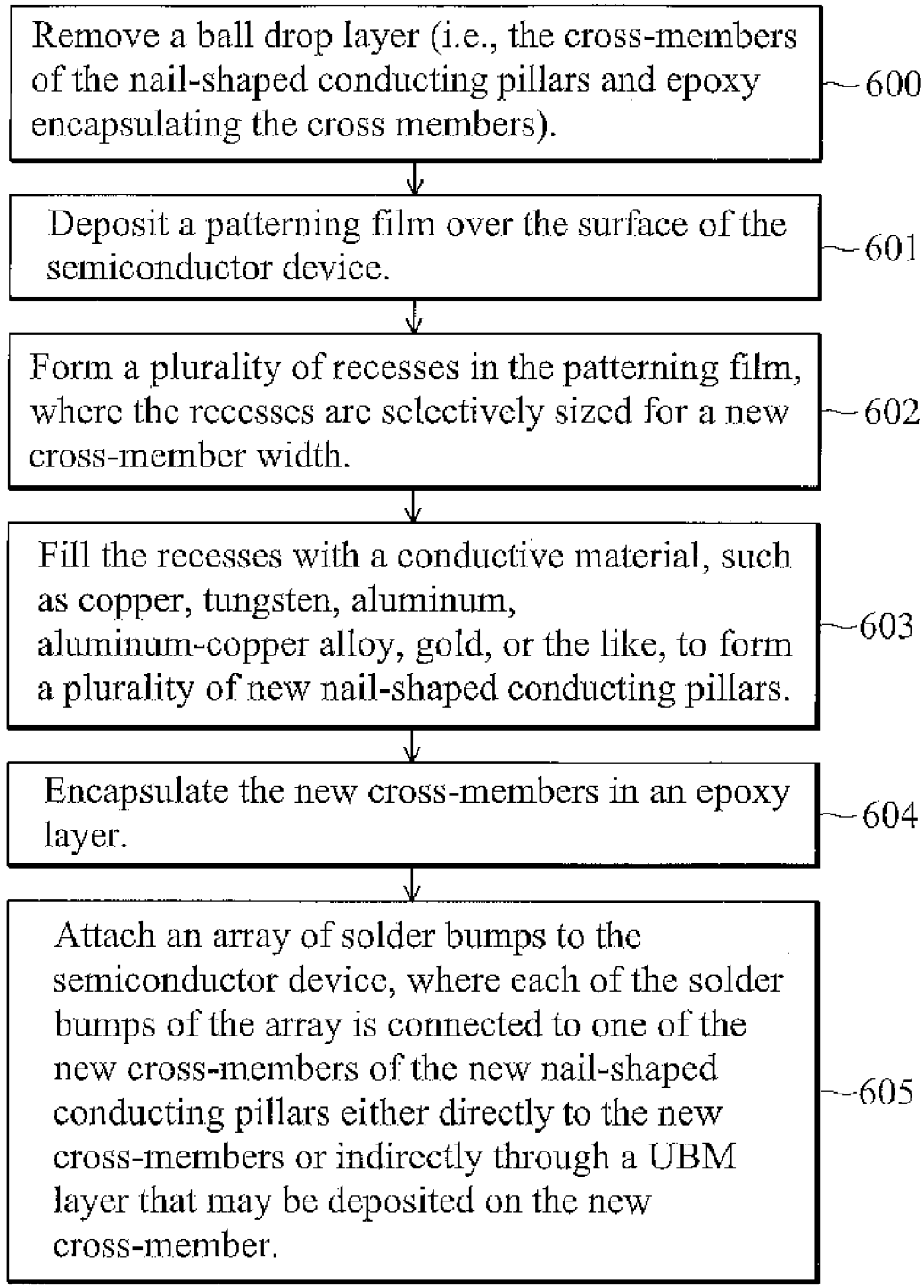
FIG. 6 is a flowchart illustrating example steps executed when implementing one embodiment of the present invention.

FIG. 6 is a flowchart illustrating example steps executed when implementing one embodiment of the present invention. In step 600, a ball drop layer (i.e., the cross-members of the nail-shaped conducting pillars and epoxy encapsulating the cross-members) is removed. A patternable film is deposited, in step 601, over the surface of the semiconductor device. A plurality of recesses is formed in the patternable film, in step 602, where the recesses are selectively sized for a new cross-member width. In step 603, the recesses are filled with a conductive material, such as copper, tungsten, aluminum, aluminum-copper alloy, gold, or the like, to form a plurality of new nail-shaped conducting pillars. The new cross-members are then encapsulated in an epoxy layer in step 604. An array of solder bumps are attached to the semiconductor device, in step 605, where each of the solder bumps of the array is connected to one of the new cross-members of the new nail-shaped conducting pillars either directly to the new cross-members or indirectly through a UBM layer that may be deposited on the new cross-members.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for modifying a ball drop layer on a semiconductor device, said method comprising:
removing said ball drop layer from a surface of said semiconductor device, said ball drop layer comprising an epoxy and a cross-member for each of a plurality of nail-shaped conducting pillars, the epoxy encapsulating said cross-member, the cross-member for at least one of the plurality of nail-shaped conducting pillars and at least a portion of the epoxy being removed;

depositing, after the removing, a laminate film over said surface;
forming a plurality of recesses in said laminate film, said plurality of recesses selectively sized for a new cross-member width; and
filling said plurality of recesses with a conductive material to form a plurality of new nail-shaped conducting pillars.

2. The method of claim 1 further comprising:
encapsulating a plurality of new cross-members of said plurality of new nail-shaped conducting pillars in an epoxy layer.

3. The method of claim 1 further comprising:
attaching an array of solder bumps to said semiconductor device, wherein each of said solder bumps of said array is connected to a corresponding one of said plurality of new nail-shaped conducting pillars at a plurality of new cross-members.

4. The method of claim 3 further comprising:
forming an under bump metallurgy (UBM) layer over each of said plurality of new cross-members, wherein each said array of solder bumps is connected to one of said plurality of nail-shaped conducting pillars through said UBM layer.

5. The method of claim 3 wherein said conductive material comprises one of:
copper;
tungsten;
aluminum;
aluminum-copper alloy; and
gold.

6. A method for manufacturing a wafer-level chip-scale packaging (WLCSP) connector array, said method comprising:
removing a first layer from a surface of a semiconductor wafer, said first layer comprising an encapsulating material and a plurality of cross-members, the plurality of cross-members each being attached to a corresponding one of a plurality of nail-shaped pillars, the plurality of cross-members being encapsulated by the encapsulating material, at least one of the plurality of cross-members being removed;
depositing, after the removing, a patternable material on said surface;
creating a pattern in said patternable material, said pattern corresponding to a plurality of new cross-members of said plurality of nail-shaped pillars;
depositing a conducting material in said pattern to form said plurality of new cross-members; and
encapsulating said plurality of new cross-members with said encapsulating material on said surface.

7. The method of claim 6 further comprising:
attaching a solder bump to each of said plurality of new cross-members.

8. The method of claim 7 further comprising:
forming an under bump metallurgy (UBM) layer over each of said plurality of new cross-members, wherein said solder bump is attached to said plurality of nail-shaped pillars through said UBM layer.

9. The method of claim 6 wherein said plurality of nail-shaped pillars is made from one of:
copper;
tungsten;
aluminum;
aluminum-copper alloy; and
gold; and
wherein said encapsulating material comprises one of:
epoxy; and
resin.

* * * * *